United States Patent [19]

Ina

[11] Patent Number: 4,669,885
[45] Date of Patent: Jun. 2, 1987

[54] APPARATUS FOR INSPECTING NEGATIVES

[75] Inventor: Hideki Ina, Yokohama, Japan

[73] Assignee: Canon Kabushiki Kaisha, Tokyo, Japan

[21] Appl. No.: 476,252

[22] Filed: Mar. 17, 1983

[30] Foreign Application Priority Data

Mar. 23, 1982 [JP] Japan ............................... 57-45777

[51] Int. Cl.⁴ ........................................... G01N 21/88
[52] U.S. Cl. ..................................... 356/443; 356/73; 356/239
[58] Field of Search ............... 356/237, 239, 429, 430, 356/431, 443, 444, 73, 152; 250/562, 563, 571, 572

[56] References Cited

U.S. PATENT DOCUMENTS

| | | | |
|---|---|---|---|
| 3,632,226 | 1/1972 | Filby | 356/444 |
| 3,693,021 | 9/1972 | Lake et al. | 356/430 |
| 3,734,624 | 5/1973 | Cornelius | 356/431 X |
| 3,746,869 | 7/1973 | Lindstept et al. | 356/73 X |
| 3,843,890 | 10/1974 | Anthony et al. | 250/563 |
| 3,877,821 | 4/1975 | Price et al. | 356/237 |
| 3,989,385 | 11/1976 | Dill et al. | 250/571 X |
| 4,173,441 | 11/1979 | Wolf | 250/563 X |
| 4,284,357 | 8/1981 | Kudo | 356/431 |
| 4,468,120 | 8/1984 | Tanimoto et al. | 356/237 |

FOREIGN PATENT DOCUMENTS

988014  3/1965  United Kingdom .

Primary Examiner—Davis L. Willis
Assistant Examiner—S. A. Turner
Attorney, Agent, or Firm—Fitzpatrick, Cella, Harper & Scinto

[57] ABSTRACT

Disclosed is an apparatus for inspecting negatives which is provided with a laser beam generating source, a scanner for scanning the laser beam, a holding device for holding a negative having a pattern formed in a reflective area on a first surface of a transparent plate and transferring the negative in a direction perpendicular to the scanning direction of the laser beam, a first converging lens for converging the laser beam on said first surface, a second converging lens for converging on a first photocell the beam transmitted through the negative, a third converging lens for converging on a second photocell the beam reflected by the first surface of the negative, and a comparator for comparing a first signal stream put out from the first photocell and a second signal stream put out from the second photocell and detecting an undesirable adhering matter.

20 Claims, 10 Drawing Figures

FIG. 3A REFLECTION

FIG. 3B TRANSMISSION

FIG. 3C LOGICAL SUM

APPARATUS FOR INSPECTING NEGATIVES

BACKGROUND OF THE INVENTION

1. Field of the Invention

This invention relates to an apparatus for inspecting objects such as negatives, and in particular to an apparatus for detecting defects such as non-transmitting dust other than the pattern for exposure of a reticle or a photomask used in the semiconductor manufacturing process.

2. Description of the Prior Art

Generally in the IC manufacturing process, a desired pattern for exposure of a reticle or a mask is transferred to a semiconductor wafer, having resist applied thereto, by the use of the projection optical system in a semiconductor printing apparatus (stepper or other mask aligner) or by the use of intimate contact process.

When the pattern is to be transferred from the reticle or mask to the wafer having resist applied thereto by the semiconductor printing apparatus, if a defect such as dust is present on the reticle or mask, the shape of the defect in addition to the original pattern of the reticle or mask will be printed and this may cause a reduced yield of the IC manufacture.

Particularly, where use is made of a "stepper" which uses a reticle to print a desired pattern on a wafer by step and repeat, a piece of dust on the reticle would be printed on the entire surface of the wafer.

Thus, in recent years, the presence of dust has become a great problem. Various methods of inspecting a defect of the pattern of a reticle or mask have heretofore been used.

These methods include "the method of comparing with the design data" and "the method of comparing adjacent chips", and are used for an automatic defect inspecting apparatus. "The method of comparing with the design data" is a method which comprises prestoring the design data which is the ideal pattern of a reticle or mask so that the design data can be processed by a computer, irradiating the reticle or mask with a laser or the like, and comparing the pattern from the transmitted light thereof with the design data to thereby detect any defect, and this method is also capable of detecting a common defect of the chips on the mask resulting from malfunctioning of a pattern generator or the like.

In this method, however, the design data handled is enormous and therefore, a long inspection time is required and high accuracy is required of the positioning of the object to be inspected.

"The method of comparing adjacent chips" comprises comparing the chip patterns on a mask to thereby detect any defect and therefore, it eliminates the necessity of using any other object of comparison than the object to be inspected, such as the design data, and only requires a short inspection time.

However, this method cannot inspect in principle in the case of one chip per reticle for a stepper.

Accordingly, neither of these prior art methods is suitable as the method for inspecting the reticle of a stepper. This is particularly so when an automated dust inspecting apparatus which requires high-speed inspection is considered.

SUMMARY OF THE INVENTION

It is a primary object of the present invention to detect any defect on a negative without using a reference negative for comparison or an adjacent negative or an electronic computer which stores information patterns therein.

It is another object of the present invention to complete the inspection in a short time.

It is still another object of the present invention to make the processing of enormous detection data unnecessary.

It is yet another object of the present invention to make aligning operation of high accuracy unnecessary.

It is a further object of the present invention to make the inspecting apparatus capable of processing data in an on-line and disposable in a semiconductor manufacturing line.

It is still a further object of the present invention to make the inspecting apparatus relatively simple in construction.

The invention will become fully apparent from the following detailed description thereof taken in conjunction with the accompanying drawings.

DESCRIPTION OF THE PREFERRED EMBODIMENTS

Figure 1:
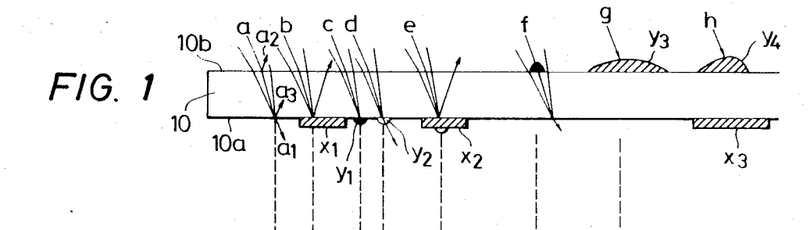
FIG. 1 is a cross-sectional view of the essential portion of the present invention.

Referring to FIG. 1 which illustrates the technical idea of the present invention, reference numeral 10 designates a reticle or a photomask comprising a transparent plate such as a glass plate having a front surface 10a on which an integrated circuit pattern is depicted with a film of a metal such as nickel chromium. x1, x2 and x3 denote pattern sections. It is to be understood that an inspecting laser beam is applied from the back side 10b of the reticle so that it is condensed on the patterned surface 10a, whereby the patterned surface is scanned by the applied laser beam.

Of the scanning light beam in FIG. 1, case a shows a case where no pattern section is present on the patterned surface 10a and the light impinges on the transparent area, and most of the incident light is transmitted in a direction indicated by a1. Actually, some of the light is reflected on the interface between the glass and the air as indicated by reflections a2 and a3, but the quantities of these reflected lights are minute and of little influence and the reflection can be reduced if the light beam is caused to enter perpendicularly or polarized light is used as will be described later. Case b shows a case where the incident light beam is condensed on an area of the reticle in which the pattern is present. In this case, the incident light is intensity reflected by the chromium-evaporated pattern section x1 and there is no transmitted light.

Figures 2A, 2B:
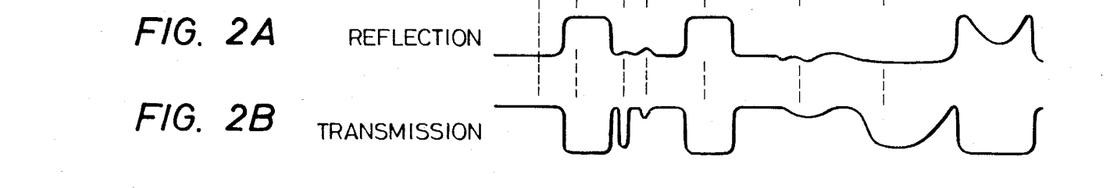
FIG. 2A shows the output waveform of a reflected light detecting photodetector.
FIG. 2B shows the output waveform of a transmitted light detecting photodetector.

FIGS. 2A and 2B show the analog outputs when the reflected light and transmitted light obtained time-serially along with the scanning of these applied lights are received by discrete photodiodes. Further, a case where dust adheres onto the patterned surface of the reticle will be considered.

Case c shows a case where non-transmitting dust y1 which will cause a problem during printing adheres to the transparent area on the patterned surface of the reticle.

In this case, due to the non-transmitting dust, there is no output of transmitted light, and there is little or no output of reflected light (regular reflected light) because light is scattered by the dust. That is, if non-transmitting dust is present on the patterned surface, there is no output of transmitted light and reflected light and such area can be discriminated from other areas.

The present invention utilizes such effect and detects the presence of non-transmitting dust by comparing the two outputs, particularly adding them together and further taking the logical sum thereof, as will be described later.

Case d shows a case where transmitting dust y2 adheres to the patterned surface.

In this case, the output of transmitted light only slightly falls and where the pattern is printed on a wafer, resist can be sufficiently sensitized.

As regards reflected light, there is no intense reflection as in case b and there is only obtained such a degree of output in which the reflected light is more or less greater than the interface reflection a3.

That is, if transmitting dust is present on the patterned surface, the output of transmitted light is high and there is little or no output of reflected light. The high output of transmitted light makes the detection of such transmitting dust originally unnecessary.

Case e shows a case where dust (non-transmitting or transmitting) adheres onto the pattern.

In this case, due to the presence of pattern sections, the applied light is intensely reflected and the outputs of reflected light and transmitted light are similar to those in case b and thus, the presence or absence of dust is of no concern.

Even if dust hides behind the pattern, it does not affect the printing and therefore, in this case, it is originally unnecessary to detect the dust.

Case f shows a case where dust adheres to the back side 10b of the reticle.

Generally, as regards the dust on the back side of the reticle, it is out of the depth of focus of the optical system of the printing apparatus and the shape of the dust is not printed on the wafer.

However, when particularly large dust has adhered to the back side of the reticle, it affects the quantity of light which illuminates the reticle, and causes irregularity of illumination.

f indicates relatively small (relative to the diameter of the applied high beam) dust on the back side of the pattern. The applied light is not condensed on the back side of the pattern but causes wide irradiation and the output of transmitted light is only slightly reduced and there is no reflected light, and this case is substantially similar to cases a and b. That is, detection of such dust (non-transmitting or transmitting) is originally unnecessary. The degree to which the dust on the back side of the pattern such as f is allowed is related to the numerical aperture (N.A.) of the lens for condensing the laser beam on the surface of the pattern and the greater is the numerical aperture, the wider becomes the irradiation and thus, larger dust is allowed.

Cases g and h show a case where unallowably large non-transmitting dust y3 or y4 adheres to the back side of the pattern. Case g shows a case where there is no pattern on the patterned surface 10a, and case h shows a case where there is a pattern on the patterned surface 10a.

In case g, there is little or no output of transmitted light and there is no output of reflected light.

In case h, the output of transmitted light is rendered completely null by the dust y4 and further by the pattern, and the output of reflected light, even if intensely reflected by the pattern, is intercepted by the dust and is therefore reduced.

The analog outputs of transmitted light and reflected light with respect to each dust condition have been described above and, as already noted, the output of reflected light is shown in FIG. 2A and the output of transmitted light is shown in FIG. 2B.

It is possible to detect non-transmitting dust on the patterned surface on the basis of the analog outputs as described above. That is, if the output of reflected light and the output of transmitted light of FIGS. 2A and 2B are added together, both the output of reflected light and the output of transmitted light are substantially null in the place where there is non-transmitting dust and as a result, the sum of the outputs is substantially zero and thus, such place is discriminated from a place where there is no non-transmitting dust (a place where the sum of the outputs is high). For example, if the outputs of FIGS. 2A and 2B are sliced at a suitable level and waveform-shaped and thereafter added together by a logic element, the output will become substantially zero in the place where there is dust.

In short, when only the output of reflected light shown in FIG. 2A is used, discrimination (c and d) from transmitting dust is difficult and, when only the output of transmitted light shown in FIG. 2B is used, discrimination (c and b) from the pattern section is difficult, but only the non-transmitting dust portion can be extracted by using both of the output of reflected light and the output of transmitted light as in the present invention.

Now, if the outputs are analog outputs, the output of transmitted light in the place where there is no pattern (which corresponds to the case a of FIG. 1) is usually higher than the output of reflected light in the place where there is a pattern (which corresponds to the case b of FIG. 1) and, when the sum of the analog outputs of reflected light and transmitted light is taken, there arises a difference in the sum of the outputs between the place where there is a pattern and the place where there is no pattern, and the waveform itself of signal becomes complicated and thus, the desire for higher accuracy becomes limited.

Figures 3A, 3B, 3C:
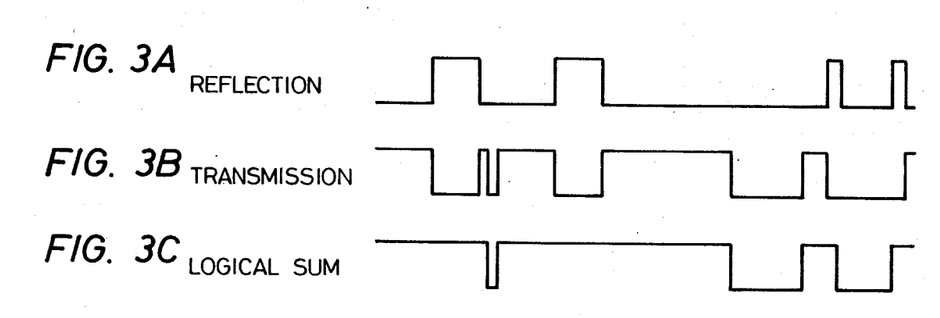
FIGS. 3A and 3B show the waveforms after electrical processing has been applied to the outputs of the photodetectors.
FIG. 3C shows the waveform after the logical sum has been taken.

Here, if each of the output of reflected light and the output of transmitted light is converted to binary form as shown in FIGS. 3A and 3B and the logical sum thereof is taken as shown in FIG. 3C, the above-noted problem will be eliminated and the signal will become simplified and thus, non-transmitting dust may be detected easily and accurately.

As regards the dust adhering to the back side of the reticle, such dust remarkably determined to the printing as in the cases g and h of FIG. 1 can be detected.

Small dust adhering to the back side of the reticle, even if it is non-transmitting, offers no problem as previously noted and need not be detected.

Adding together the transmitted output and the reflected output has been described above, but detection of defect is also possible by another form of output comparison, for example, by taking the difference between the two outputs. That is, only a defective portion can be extracted by suitable setting of the slice level in the differential output. In this case, however, the waveform of the signal is more complicated than in the case of addition.

Description has been made of the front and back sides, respectively, of the reticle, and description will now be made of the front and back sides of the reticle at a time. In this method, as shown in FIG. 1, a laser beam is applied from the back side of the reticle so that it is condensed on the patterned surface, and the laser beam is scanned in one direction. This method utilizes the fact that the information of "the desired pattern"+"the dust adhering to the pattern on the back side of the reticle (case h)" can be obtained from the reflected light and the information of "the desired pattern"+"the dust on the patterned surface of the reticle (case c)"+"the dust adhering to the transparent portion of the back side of the reticle (case g)" can be obtained from the transmitted light. Where the logical sum of the outputs of the reflected light and the transmitted light is taken by converting them to binary form, regarding the information of "the desired pattern", assuming that the reflected light is the positive logic, the information is included in the form of the negative logic in the transmitted light and therefore, by taking the logical sum thereof, it is possible to obtain the other information than the information of "the desired pattern", i.e. the information of only "the dust".

Accordingly, the present invention can detect a defect such as non-transmitting dust without the necessity of specially preparing a pattern which provides the standard and without the necessity of comparing the pattern with an adjacent chip pattern. Not using a data which provides the standard means that highly accurate alignment is made unnecessary. Also, high-speed treatment becomes possible by causing the incident beam to scan at a high speed.

Thus, according to the present invention, with regard to a defect such as non-transmitting dust which offers a problem during wafer printing, the presence, the location and the size of such defect can be detected on both sides of the reticle at a time.

Figure 4:
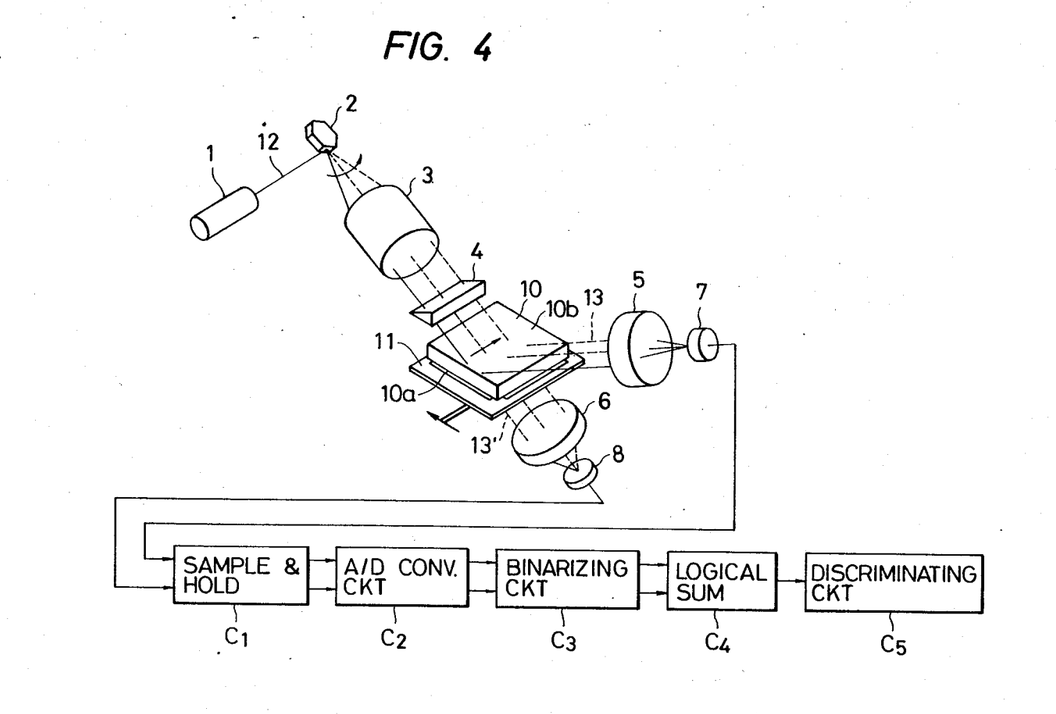
FIG. 4 is a perspective view showing a first embodiment of the present invention.

FIG. 4 shows an embodiment of the apparatus of the present invention using such principle.

In the Figure, reference numeral 1 designates a laser light source, reference numeral 2 denotes a rotational polygon mirror rotated at a constant speed, and reference numeral 3 designates an f-$\theta$ lens. Designated by 4 is an aberration correcting plate of a varying thickness. The aberration correcting plate 4 corrects the difference in length in the glass of a mask 10 between the upper edge light ray and the lower edge light ray of the light beam obliquely entering the glass of the mask and converged therein. Reference numerals 5 and 6 denote condenser lenses, and reference numerals 7 and 8 designate photoelectric conversion elements.

The beam 12 from the laser 1 is deflected in one direction by the polygon mirror 2 and passes through the f-$\theta$ lens 3 and the aberration correcting plate 4 which corrects the influence of oblique incidence, and enters the reticle from the back side 10$b$ thereof and is condensed on the patterned surface 10$a$ of the reticle. This is accomplished, for example, by a construction in which the polygon mirror 2 and the reticle are spaced apart from the f-$\theta$ lens 3 by the focal length thereof.

The numerical aperture of the f-$\theta$ lens 3 is usually determined so as to correspond to the optical system of the printing apparatus, and the minimum size of a detected defect on the pattern surface 10$a$ is determined by this numerical aperture.

The greater is the numerical aperture, detection of the smaller dust will be possible.

Any small dust adhering to the back side 10$b$ is out of the depth of focus as already described and is intactly exposed to light without being detected.

It is possible to make adjustment such that when the thickness of the reticle varies, the laser beam is condensed on the patterned surface 10$a$ by moving the correcting plate 4 back and forth.

In the present embodiment, it is for the purpose of eliminating the reflection of a2 and a3 of FIG. 1 that the laser beam is obliquely incident on the reticle, and it becomes possible to accomplish detection at high S/N by using a rectilinear polarization type laser to cause the beam to be incident on the reticle as P-polarized light (rectilinearly polarized light parallel to a plane containing the incidence and reflection axes) at Brewster's angle.

The reflected light 13 from the patterned surface 10$a$ and the transmitted light 13' are condensed by the condenser lenses 5 and 6, respectively, and are introduced into a computer by the photoelectric conversion elements 7 and 8 and processed therein.

An electronic circuit C1 is a sample and hold circuit, C2 is an A/D converting circuit, C3 is a binary conversion circuit, C4 is a circuit for taking the logical sum, and C5 is a discriminating circuit. An electronic computer may preferably be used as the circuits C3 - C5. The sample and hold circuit C1 holds one-scanning signals of the signal trains from the photoelectric conversion elements 7 and 8 and transforms them into multivalues, whereafter the multivalues are converted to digital form by the A/D converting circuit C2 and applied as input to the electronic computer. Each signal is converted to binary form in the computer, whereafter the logical sum thereof is taken, whereby the signal resulting from dust can be discriminated. Utilizing the electronic computer instead of making the circuits C3–C5 into discrete circuits leads to the advantage that a change of the threshold value during conversion to binary form can be easily accomplished.

On the other hand, when the photoelectrically converted signals are converted to binary form and the logical sum thereof is taken, where the same signal is introduced N times and the average value of the N times of signals is used as the true signal, the accuracy is statistically improved by $\sqrt{N}$ times. This is advantageous to enhance the accuracy although the time required for the introduction of the signal is increased. The signal processing circuit of FIG. 4 is suitable for such processing.

Where the signal is introduced several times and the average thereof is taken, averaging the analog signals shown in FIG. 2 results in higher accuracy than averaging the binary signals shown in FIG. 3. To make the most of this advantage, the analog signals transformed into multivalues by the sample and hold circuit C1 and converted into bit signals by the A/D converting circuit C2 are used when applied as input to the electronic computer.

Here, if a stage 11 to which the edges of the reticle 10 are adsorbed is stepwisely moved in the direction of the arrow, inspection of the entire surface of the reticle will become possible. Alternatively, the stage may be made stationary and the laser beam may be caused to scan two-dimensionally.

Figure 5:
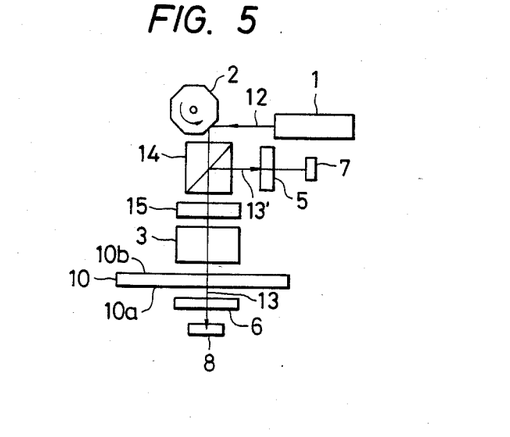
FIG. 5 is a cross-sectional view showing a second embodiment of the present invention.

FIG. 5 shows another embodiment of the present invention in which the irradiation is effected on the basis of perpendicular incidence.

In this embodiment, the use of a polarizing beam splitter 14 and a quarter wavelength plate 15 makes it possible to efficiently introduce the reflected light 12 by using polarized light. That is, the laser beam is made into P-polarized light and the laser beam entering the polarizing beam splitter 14 passes completely therethrough and further passes through the quarter wavelength plate 15, thus becoming circularly polarized light, and the light reflected by the patterned surface 10a of the reticle again passes through the quarter wavelength plate 15 and now becomes S-polarized light, which is completely reflected by the polarizing beam splitter 14 and introduced into the photoelectric conversion element 7 without any loss of the quantity of light. The reflection on the back side 9 of the reticle is small, say, about 4%, and hardly affects the output of reflected light.

Figure 6A:
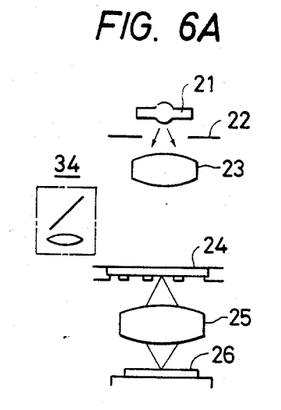
FIGS. 6A and 6B are cross-sectional views showing a third embodiment of the present invention.
Figure 6B:
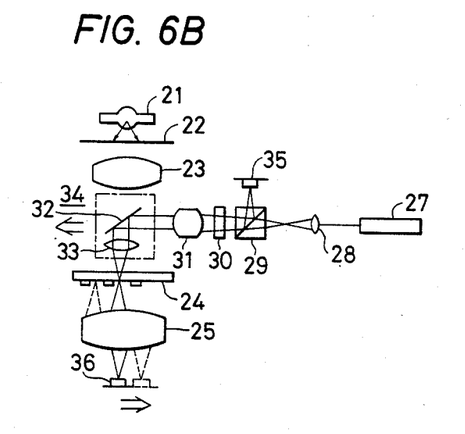

FIGS. 6A and 6B show a third embodiment of the present invention in which pattern defect inspection can be effected in the exposure station of a mask aligner. If the pattern defect inspection of a reticle or a mask is effected in the other place than the exposure station and thereafter the reticle or the mask is carried into the exposure station, dust may adhere thereto during or after the carrying into the exposure station and if such reticle or mask is intactly exposed to light, it may result in a reduced yield, whereas a new inspection becomes possible by placing the exposure station into the printing apparatus as in the present embodiment and thus, the problem mentioned above can be solved.

FIG. 6A shows the system during exposure and FIG. 6B shows the system during inspection.

In FIG. 6A, reference numeral 21 designates a light source for exposure, reference numeral 22 denotes a shutter, reference numeral 23 designates an illuminating optical system (exemplified by a single condenser lens), reference numeral 24 denotes a reticle (a mask), reference numeral 25 designates a projection optical system, and reference numeral denotes a wafer. The reticle 24 and the wafer 26 are secured to respective chucks.

During exposure, the shutter 22 is opened and the light from the light source for exposure reaches the reticle (mask) 24, and the pattern of the reticle (mask) is printed on the wafer 26 by means of the projection optical system 25. In FIG. 6B, reference numeral 27 designates a laser, reference numeral 28 denotes a beam expanding microscope objective lens, reference numeral 29 designates a polarizing beam splitter, reference numeral 30 denotes a quarter wavelength plate, and reference numeral 31 designates a collimator lens. Reference numeral 32 denotes a mirror, and reference numeral 33 designates a condenser lens. These together constitute a movable optical system 34 movable as a unit along the reticle (mask) 24.

The beam (P-polarized light) from the laser 27 is stopped down by the microscope objective lens 28 and passes completely through the polarizing beam splitter 29 and through the quarter wavelength plate 30, whereby it is made into circularly polarized light, which passes through the collimator lens 31 and is thereby made into a parallel light beam having its diameter expanded.

This parallel light beam is bent by the mirror 32 and condensed on the patterned surface (i.e., the lower surface) of the reticle (mask) 24 by the condenser lens 33.

The light reflected by the patterned surface reversely follows the aforementioned optical path, again passes through the quarter wavelength plate 30 and is thereby made into S-polarized light, which is totally reflected by the polarizing beam splitter 29 and condensed on a photoelectric conversion element 35 provided at the focus position of the collimator lens 31.

On the other hand, the light transmitted through the patterned surface is condensed on a photoelectric conversion element 36 provided at the focus position of the projection optical system 25, by this projection optical system 25.

When the movable optical system 34 is moved along the reticle (mask) 24 as indicated by arrow, the position of the condensed beam moves as indicated by broken line and the imaged position thereof is reversed by the projection optical system and therefore, the photoelectric conversion element 36 can be moved in synchronism with and in the direction opposite to the movement of the movable optical system 34. During inspection, the shutter 22 is closed so that the light from the light source 21 for exposure may not enter the reticle (mask) 24. Alternatively, during inspection, the light source for exposure may be electrically turned off. The above-described dust detecting optical system may be provided between the shutter 22 and the illuminating optical system (condenser lens) 23, or the illuminating optical system (condenser lens) 23 may be provided at a position displaced from its original position during inspection.

If a CCD or other long-footage sensor is used as the photoelectric conversion element 36, it need not be moved.

When inspection of a row is terminated, the optical system 27-31 is slightly moved in a direction perpendicular to the plane of the drawing sheet, whereby inspection is again effected from the end portion. The embodiments so far described employ a laser as the light source, whereas this is not restrictive but other light source may also be employed and an electron beam or soft X-rays or the like may also be used. The laser beam is condensed on the patterned surface, but in some cases the laser beam is not condensed in the relation to the required accuracy. Further, if design is made such that the light from the inspected area is imaged on a photosensor array instead of being simply condensed, a sheet-like light beam can be used as the illuminating light beam.

I claim:

1. An inspecting method comprising the steps of:
   holding a transparent body, a reflective pattern being formed on one of the opposed surfaces of said transparent body;
   producing radiant energy;
   applying said radiant energy from the side of said body on which said reflective pattern is not formed so as to cause said radiant energy to converge so that the convergency of said radiant energy is greater on the surface on which said reflective pattern is formed than on the surface on which said reflective pattern is not formed;

moving the area irradiated with the radiant energy and said body relative to each other;

receiving the radiant energy reflected by said pattern and producing a first output;

receiving the radiant energy transmitted through said body and producing a second output; and discriminating that the radiant energy applied area includes defects, when said first output is smaller than an output to be obtained in the normal reflection of said radiant energy on said pattern and said output is smaller than an output to be obtained in the normal transparence of said radiant energy through said pattern.

2. An inspecting method according to claim 1, wherein said radiant energy is laser.

3. An inspecting method according to claim 2, wherein said laser has a P-polarization characteristic.

4. An inspecting method according to claim 1, wherein said step of discriminating includes a sample and hold step, an A/D converting step, a binary conversion step, and a step of forming the logical sum.

5. A mask aligner provided with;

first holding means for holding a transparent negative, a reflective semiconductor circuit pattern being formed on one of the opposed surfaces of said transparent negative;

beam producing means for producing an inspecting beam;

projection means for projecting said inspecting beam from the side of said negative on which said pattern is not formed so as to cause said inspecting beam to converge so that the convergency of said inspecting beam is greater on the surface on which said pattern is formed that on the surface on which said pattern is not formed;

second holding means for holding a recording carrier responsive to the projected image of said pattern;

first detecting means for receiving the inspecting beam reflected by said negative;

second detecting means for receiving the inspecting beam transmitted through said negative; and discriminating means for discriminating that a defect is included in the area to which said inspecting beam is applied, when an output of said first detecting means is smaller than an output of said first detecting means in the normal reflection of said inspecting beam on said pattern, and an output of said second detecting means is smaller than an output of said second detecting means in the normal transparence of said inspecting beam through said pattern.

6. An apparatus for inspecting defects included in a transparent body, a reflective pattern being formed on one of the opposed surfaces of said transparent body, comprising:

projection means for projecting a beam from the side of said body on which said pattern is not formed so as to cause said beam to converge so that the convergency of said beam is greater on the surface on which said pattern is formed than on the surface on which said pattern is not formed;

first detecting means for detecting the beam reflected by said pattern;

second detecting means for detecting the beam transmitted through said body; and discriminating means for discriminating that a defect is included in the area to which said beam is applied, when an output of said first detecting means is smaller than an output of said first detecting means in the normal relection of said beam on said pattern, and an output of said second detecting means is smaller than an output of said second detecting means in the normal transparence of said beam through said pattern.

7. An inspecting apparatus according to claim 6, wherein said discriminating means comprises means for taking the sum of the outputs of said first and second detecting means.

8. An inspecting apparatus according to claim 7, wherein said discriminating means further comprises means for converting the outputs of said first and second detecting means to digital form.

9. An inspecting apparatus according to claim 8, wherein said discriminating means carries out the discrimination on the basis of the sum of digitalized outputs of said first and second detecting means.

10. An inspecting apparatus according to claim 6, wherein said projecting means scans the beam relative to said body.

11. An inspecting apparatus according to claim 10, wherein said projecting means scans the beam relative to said body at a constant speed.

12. An inspecting apparatus according to claim 11, wherein said projecting means obliquely projects the beam to said body.

13. An inspecting apparatus according to claim 12, wherein said projecting means comprises means for correcting the aberrations of the converged point of the beam.

14. An inspecting apparatus according to claim 13, wherein said projecting means projects a linearly polarized beam.

15. An inspecting apparatus according to claim 14, wherein said projecting means projects a P-polarized beam.

16. An inspecting apparatus according to claim 15, wherein said projecting means projects a laser beam.

17. An inspecting apparatus according to claim 6, wherein said body is used during the manufacturing of a semiconductor.

18. An inspecting apparatus according to claim 6, wherein said body moves in a predetermined direction relative to the beam.

19. An inspecting apparatus according to claim 18, wherein said projecting means scans the beam in a direction different from that of the movement of said body.

20. An inspecting apparatus according to claim 19, wherein at least one of said first and second detecting means comprises a sensor array arranged in the direction of said beam scan.

* * * * *

UNITED STATES PATENT AND TRADEMARK OFFICE
CERTIFICATE OF CORRECTION

PATENT NO. : 4,669,885
DATED : June 2, 1987
INVENTOR(S) : HIDEKI INA

It is certified that error appears in the above-identified patent and that said Letters Patent is hereby corrected as shown below:

COLUMN 7

Line 50, "numeral denotes" should read --numeral 26 denotes--.

COLUMN 9

Line 13, "output" should read --second output--.
Line 25, "with;" should read --with:--.

Signed and Sealed this

Twenty-second Day of September, 1987

Attest:

DONALD J. QUIGG

Attesting Officer            Commissioner of Patents and Trademarks